United States Patent
Hsiao et al.

(10) Patent No.: US 12,327,785 B2
(45) Date of Patent: Jun. 10, 2025

(54) HIGH VOLTAGE PASSIVE DEVICE STRUCTURE

(71) Applicant: Taiwan Semiconductor Manufacturing Company, Ltd., Hsinchu (TW)

(72) Inventors: Yuan-Yang Hsiao, Hsinchu (TW); Hsiang-Ku Shen, Hsinchu (TW); Wen-Chiung Tu, Hsinchu (TW); Tsung-Chieh Hsiao, Changhua County (TW); Chen-Chiu Huang, Hsinchu (TW); Dian-Hau Chen, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 697 days.

(21) Appl. No.: 17/708,998

(22) Filed: Mar. 30, 2022

(65) Prior Publication Data
US 2023/0317593 A1    Oct. 5, 2023

(51) Int. Cl.
*H01L 23/522*    (2006.01)
*H01L 23/532*    (2006.01)

(52) U.S. Cl.
CPC ...... *H01L 23/5223* (2013.01); *H01L 23/5226* (2013.01); *H01L 23/53295* (2013.01)

(58) Field of Classification Search
CPC ............. H01L 23/5223; H01L 23/5226; H01L 23/53295; H01L 23/5222
See application file for complete search history.

(56) References Cited

U.S. PATENT DOCUMENTS

| | | | | |
|---|---|---|---|---|
| 11,043,456 | B2* | 6/2021 | Park | H10B 12/00 |
| 11,276,748 | B2* | 3/2022 | Li | H01G 4/008 |
| 11,532,697 | B2* | 12/2022 | Tsai | H01L 23/528 |
| 11,961,880 | B2* | 4/2024 | Hsiao | H10D 1/68 |
| 2012/0241906 | A1* | 9/2012 | Nakanishi | H01L 23/49822 257/532 |
| 2013/0270675 | A1* | 10/2013 | Childs | H01L 28/60 257/532 |
| 2020/0006183 | A1 | 1/2020 | Huang et al. | |

(Continued)

FOREIGN PATENT DOCUMENTS

| | | |
|---|---|---|
| TW | 201926378 A | 7/2019 |
| TW | 202211488 A | 3/2022 |

*Primary Examiner* — Zandra V Smith
*Assistant Examiner* — John M Parker
(74) *Attorney, Agent, or Firm* — HAYNES AND BOONE, LLP

(57) ABSTRACT

A device structure according to the present disclosure includes a metal-insulator-metal (MIM) stack. The MIM stack includes at least one lower conductor plate layer, a first insulator layer disposed over the at least one lower conductor plate layer, a first conductor plate layer disposed over the first insulator layer, a second insulator layer disposed over the first conductor plate layer, and a second conductor plate layer disposed over the second insulator layer. The device structure further includes a ground via extending through and electrically coupled to a first ground plate in the first conductor plate layer and a first via extending through and electrically coupled to a high voltage plate in the second conductor plate layer. The first ground plate vertically overlaps the high voltage plate and the second insulator layer is different from the first insulator layer.

20 Claims, 9 Drawing Sheets

(56) References Cited

U.S. PATENT DOCUMENTS

| | | | |
|---|---|---|---|
| 2020/0211955 A1* | 7/2020 | Rubin | H01L 28/60 |
| 2021/0098399 A1 | 4/2021 | Huang et al. | |
| 2021/0249350 A1 | 8/2021 | Shen et al. | |
| 2021/0265262 A1 | 8/2021 | Hsiao et al. | |
| 2021/0376058 A1* | 12/2021 | Shen | H10D 1/716 |
| 2023/0130905 A1* | 4/2023 | Schmidt | H01L 28/60 |
| | | | 257/532 |

* cited by examiner

HIGH VOLTAGE PASSIVE DEVICE STRUCTURE

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

As the geometry size of IC devices decreases, passive devices that require large surface areas are moved to back-end-of-line (BEOL) structures. Metal-Insulator-Metal (MIM) capacitors are among examples of such passive devices. A typical MIM capacitor includes multiple conductor plate layers that are insulated from one another by multiple insulator layers. In some instances, more than one MIM capacitor may be fabricated to serve different functions. Although existing MIM structures are generally adequate for their intended purposes, they are not satisfactory in every aspect.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
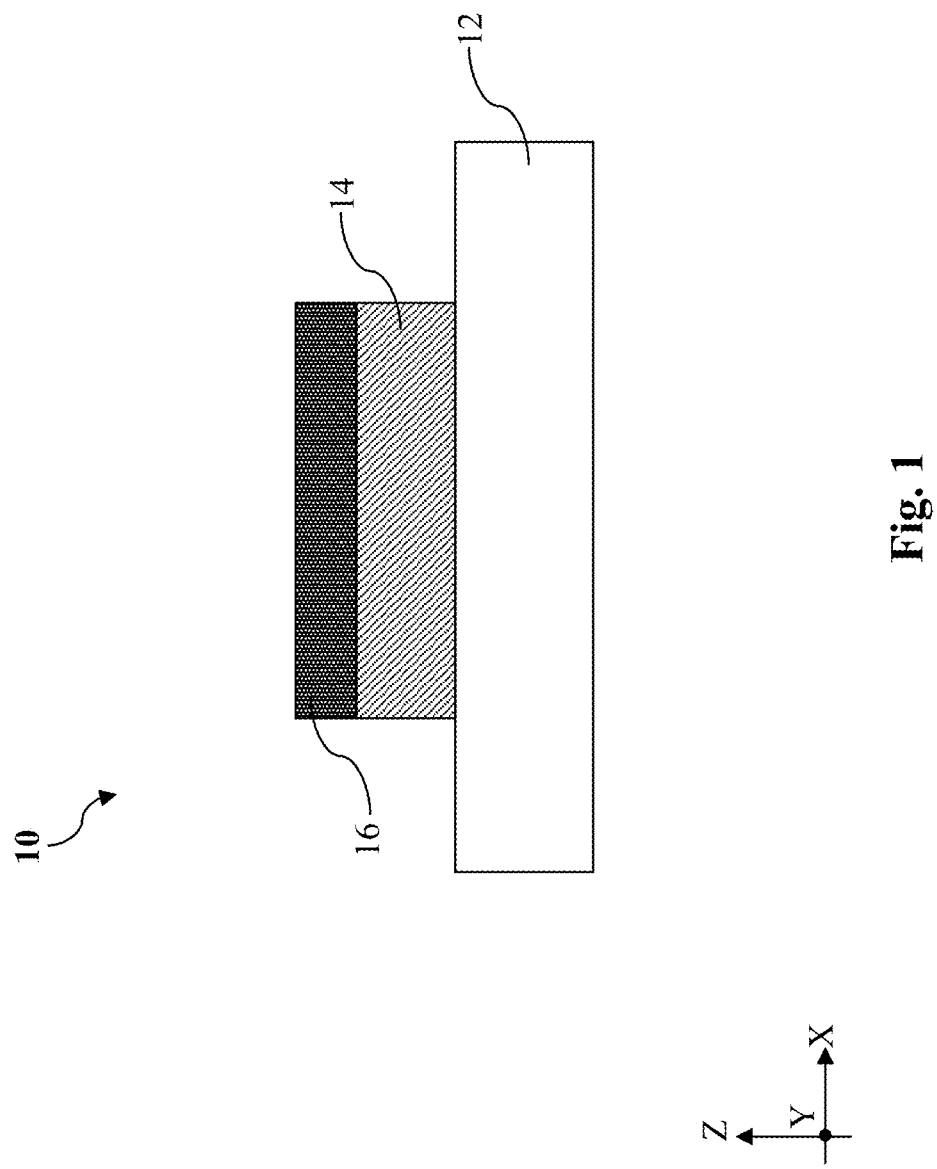
FIG. 1 is a schematic cross-sectional view a first conductor plate layer of a metal-insulator-metal (MIM) structure during a patterning process, according to various aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.25 nm to 5.75 nm where manufacturing tolerances associated with depositing the material layer are known to be +/−15% by one of ordinary skill in the art. Still further, the present disclosure may repeat reference numerals and/or letters in the various examples. This repetition is for the purpose of simplicity and clarity and does not in itself dictate a relationship between the various embodiments and/or configurations discussed.

Metal-Insulator-Metal (MIM) capacitors have been widely used in functional circuits such as mixed signal circuits, analog circuits, Radio Frequency (RF) circuits, Dynamic Random Access Memories (DRAMs), embedded DRAMs, and logic operation circuits. In system-on-chip (SOC) applications, different capacitors for different functional circuits have to be integrated on a same chip to serve different purposes. For example, in mixed-signal circuits, capacitors are used as decoupling capacitors and high-frequency noise filters. For DRAM and embedded DRAM circuits, capacitors are used for memory storage, while for RF circuits, capacitors are used in oscillators and phase-shift networks for coupling and/or bypassing purposes. For microprocessors, capacitors are used for decoupling. As its name suggests, an MIM capacitor includes a sandwich structure of interleaving metal layers and insulator layers. An example MIM capacitor includes a plurality of conductor plate layers, each of which is insulated from an adjacent conductor plate layer by an insulator layer. As an MIM capacitor is fabricated in a BEOL structure to have a larger surface area, its conductor plate layers extend over multiple underlying top metal contact features that are connected to logic or control circuitry.

Designing and fabrication of MIM capacitors are not without challenges. Front-end-of-line (FEOL) active devices, such as transistors may serve different functions and operate at different voltages. For example, some of the transistors may function as logic gates in logic/core circuits and some other transistors may function as high voltage transistors. Logic/core transistors may operate at a standard operating voltage between about 0.8 volts and about 1.5 volts while high voltage transistors may operate at an operating voltage between about 1.8 volts and about 4.0 volts. To maximize capacitance and minimize a total thickness of an MIM capacitor, each of the insulator layers is formed with a tight safety margin. That is, any process variation that undercut the safety margin may result in breakdown the insulator layers and increased defect density. The higher operating voltage of the high voltage transistor does not help the situation as it increases the possibility of a dielectric breakdown.

While it appears that a direction of an electric field across two adjacent conductor plates in an MIM structure should not affect time-dependent-dielectric-breakdown (TDBD), it is observed that it plays an important role in high voltage applications. FIGS. 1-5 illustrate the mechanism by which the direction of the electric field matters. FIG. 1 is a schematic cross-sectional view of a device structure 10, which may be a precursor of an MIM structure. The device structure 10 includes a passivation layer 12, a first conductor plate layer 14 disposed on the passivation layer 12, and a hard mask layer 16 for patterning of the first conductor plate layer 14. The first conductor plate layer 14 is deposited using chemical vapor deposition (CVD), physical vapor deposition (PVD), or a suitable method. In the depicted implementation, the first conductor plate layer 14 has been patterned by an etch process with the hard mask layer 16 serving as an etch mask. In some embodiments, the passivation layer 12 may include silicon oxide, undoped silica glass (USG), or other suitable dielectric materials, the first conductor plate layer 14 may include titanium nitride or tantalum nitride, and the hard mask layer 16 may include silicon oxide, silicon nitride, silicon carbide or a combination thereof. The patterning of the first conductor plate layer 14 may be performed using a dry etch process, such as a reactive-ion-etching (RIE). The direction etch process 22 may include use of oxygen ($O_2$), nitrogen ($N_2$), a fluorine-containing gas (e.g., $CF_4$, $NF_3$, $SF_6$, $CH_2F_2$, $CHF_3$, and/or $C_2F_6$), a hydrocarbon (e.g. methane), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, other suitable gases and/or plasmas, and/or combinations thereof.

Figure 2:
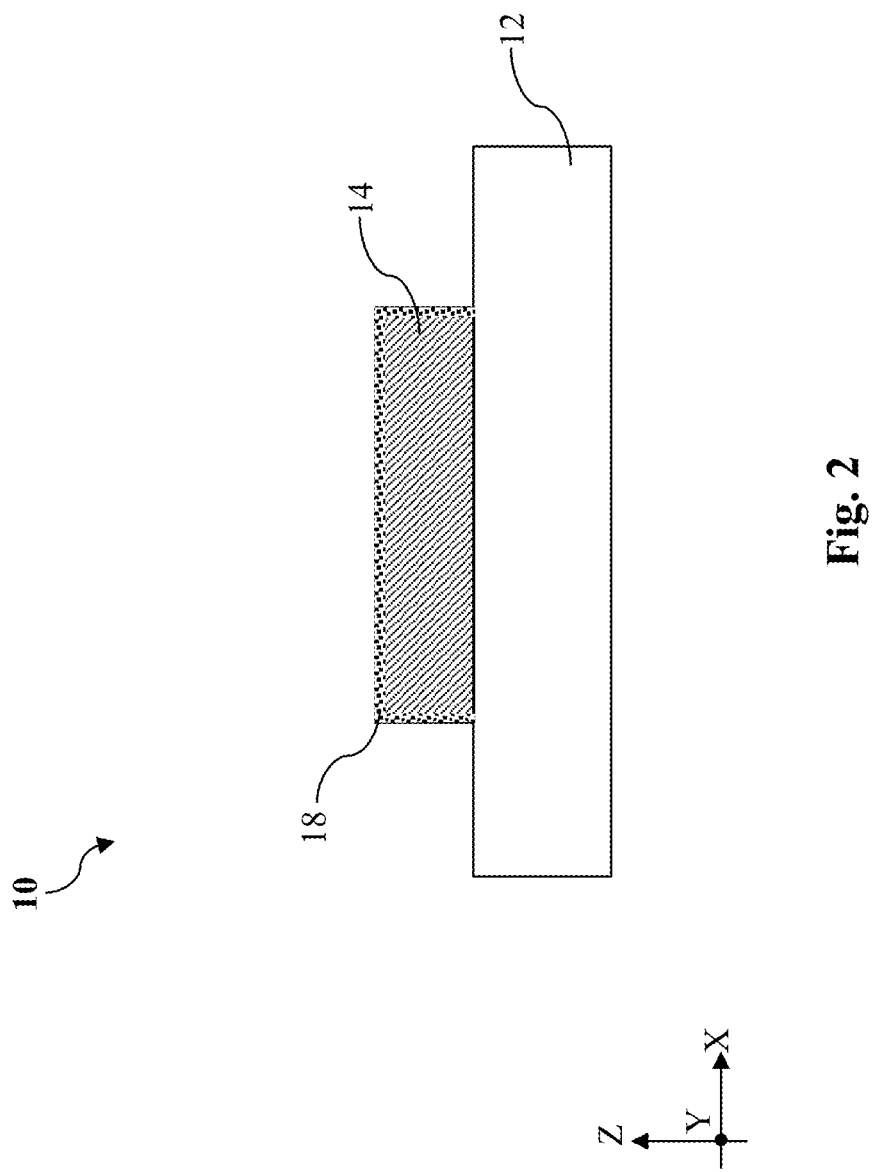
FIG. 2 is a schematic cross-sectional view of the first conductor plate layer in FIG. 1 after removal of a hard mask, according to various aspects of the present disclosure.

Reference is then made to FIG. 2. After the patterning of the first conductor plate layer 14, the hard mask layer 16 is selectively removed. For example, when the hard mask layer 16 is formed of silicon nitride, the removal of the hard mask layer 16 may include use of hot orthophosphoric acid ($H_3PO_4$). When the hard mask layer 16 is formed of other dielectric materials, other etchants or etching processes are possible. While the etching of the hard mask layer 16 is intended to be selective to the hard mask layer 16, it inevitably etches the exposed surfaces of the first conductor plate layer 14. For the ease of illustration, the surface of the first conductor plate layer 14 that is etched or damaged during the removal of the hard mask layer 16 is labeled as a damaged surface 18 in FIG. 2. While not explicitly shown in FIG. 2, the damaged surface 18 is a roughened surface with lots of imperfections. The imperfections of the damaged surface 18 may act as traps for electrons.

Figure 3:
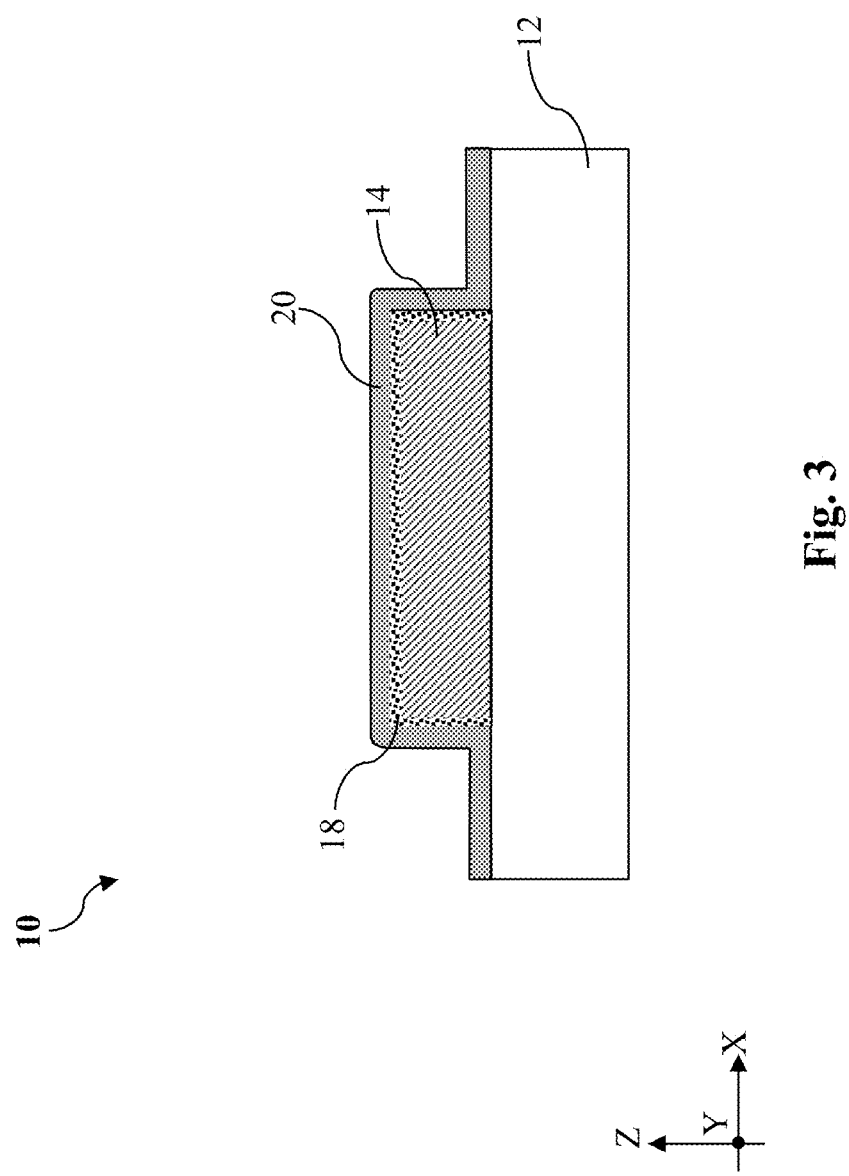
FIG. 3 is a schematic cross-sectional view showing an insulator layer being conformally deposited over the first conductor plate layer in FIG. 2, according to various aspects of the present disclosure.
Figure 4:
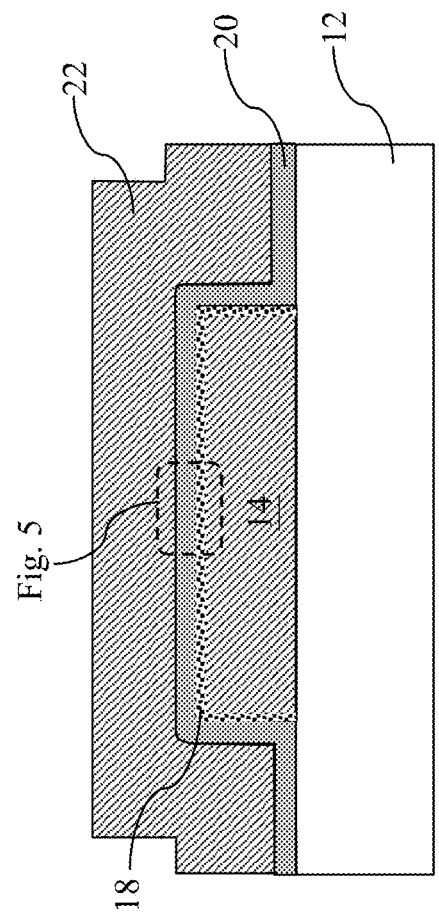
FIG. 4 is a schematic cross-sectional view showing a second conductor plate layer being deposited over the insulator layer in FIG. 3, according to various aspects of the present disclosure.

Reference is then made to FIG. 3. After the hard mask layer 16 is removed and the damaged surface 18 on the first conductor plate layer 14 is formed, a first insulator layer 20 is conformally deposited over the passivation layer 12 and the damaged surface 18 using chemical vapor deposition (CVD), atomic layer deposition (ALD), or a suitable deposition method. The first insulator layer 20 may include a high-k dielectric material, such as hafnium oxide, hafnium aluminum oxide, hafnium zirconium oxide, zirconium oxide, zirconium aluminum oxide, aluminum oxide, silicon nitride, or a combination thereof. Referring then to FIG. 4, after the conformal deposition of the first insulator layer 20, a second conductor plate layer 22 is deposited using CVD, PVD, or a suitable method. Similar to the first conductor plate layer 14, the second conductor plate layer 22 may include titanium nitride or tantalum nitride. While not explicitly shown in the figures, the second conductor plate layer 22 is also patterned using techniques similar those used to pattern the first conductor plate layer 14. Depending on the design of the device structure 10, additional insulator layers and conductor plate layers may be deposited over the second conductor plate layer 22. Each of these additional conductor plate layers is patterned.

Figure 5:
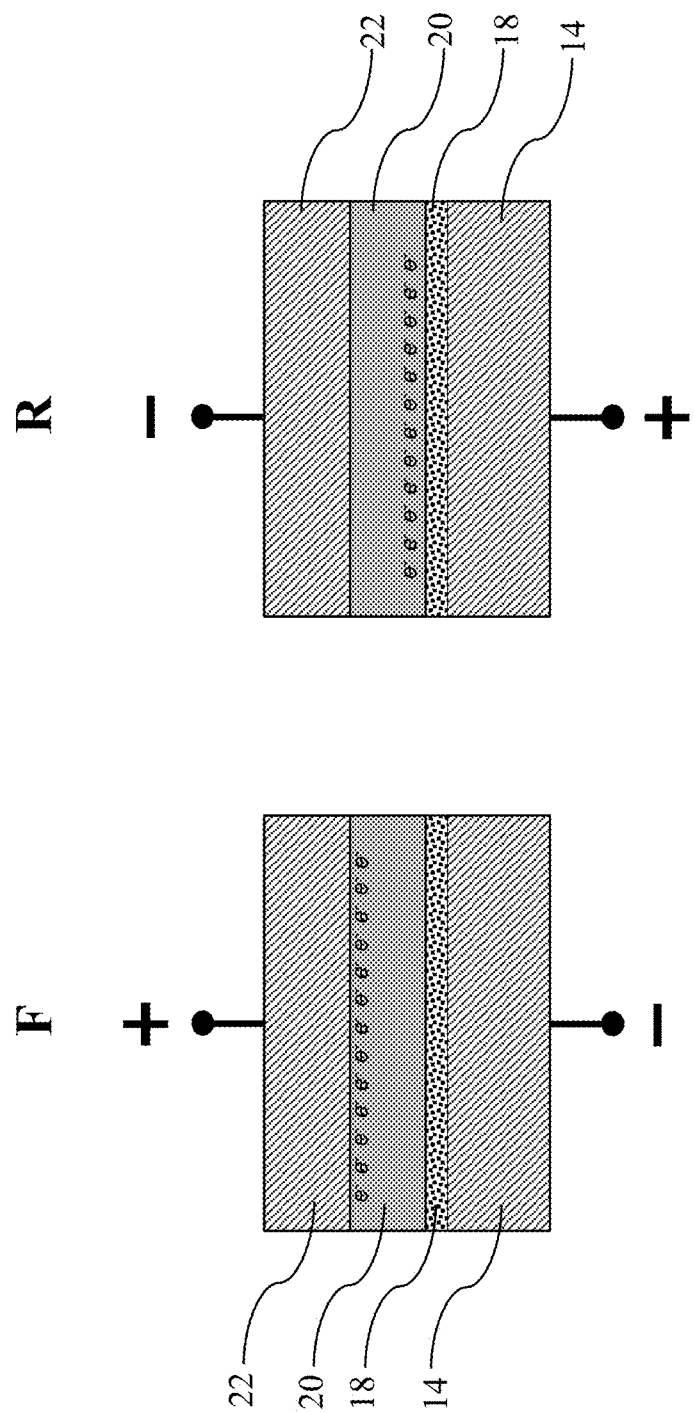
FIG. 5 illustrates an enlarged view of the interfaces among the first conductor plate layer, the insulator layer, and the second conductor plate layer when different biases are applied, according to various aspects of the present disclosure.

The dotted area in the FIG. 4 is enlarged and shown in FIG. 5. As described above, the first conductor plate layer 14 and the second conductor plate layer 22 are formed of the same material. In some embodiments, they may even have substantially the same thickness. That said, they are not entirety the same when it comes to interfacing the first insulator layer 20. As described above in conjunction with FIG. 2, the top surface and sidewalls of the first conductor plate layer 14 are subject to the etch process intended to remove the hard mask layer 16. The etch process forms a roughened damaged surface 18. The first insulator layer 20 is deposited directly on the damaged surface 18. The first insulator layer 20 is not subject to any patterning before the deposition of the second conductor plate layer 22 thereon. Although the second conductor plate layer 22 is patterned and undergoes removal of a hard mask layer deposited thereon, a bottom surface of the second conductor plate layer 22 is never affected by any etch process. More particularly, when the second conductor plate layer 22 is patterned, its bottom surface is in contact with a top surface of the first insulator layer 20 and is shielded from etchants used to pattern the second conductor plate layer 22 or to remove a hard mask layer thereon. As illustrated in FIG. 5, the first insulator layer 20 is sandwiched directly between the damaged surface 18 of the first conductor plate layer 14 and the unetched bottom surface of the second conductor plate layer 22. That said, the first conductor plate layer 14 is capacitively coupled to the second conductor plate layer 18 by way of the first insulator layer 20.

It has been observed that the presence of the damaged surface 18 materially affects breakdown of the first insulator layer 20. Reference is now made to FIG. 5. For ease of reference, a forward bias (F) is said to be applied between the first conductor plate layer 14 and the second conductor plate layer 22 when the first conductor plate layer 14 is brought to a ground voltage and the second conductor plate layer 22 is coupled to a higher voltage. A reverse bias (R) is said to apply between the first conductor plate layer 14 and the second conductor plate layer 22 when the first conductor plate layer 14 is coupled to a higher voltage and the second conductor plate layer 22 is brought to a ground voltage. A shown in FIG. 5, when a forward bias (F) is applied, the electric field points from the second conductor plate layer 22 to the first conductor plate layer 14. This electric field exerts force on the negatively charged electrons (e⁻) in a direction opposite to that of the electric field. As a result, free electrons in the first insulator layer 18, being acted upon by the forward electric field, may accumulate near the bottom surface of the second conductor plate layer 22, which is not roughened or damaged by any etching processes. When a reverse bias (R) is applied, the electric field points from the first conductor plate layer 14 to the second conductor plate layer 22. The electric field exerts force on the negatively charged electrons (e⁻) in a direction opposite to that of the electric field. As a result, free electrons in the first insulator layer 18, being acted upon by the reverse electric field, may accumulate near the damaged surface 18 of the first conductor plate layer 14.

Reference is still made to FIG. 5. When the reverse bias (R) is applied, the damaged surface 18 acts as traps of the free electrons up to certain ranges of electric fields and temperatures. When these ranges are exceeded for any reason, additional electrons in addition to the trapped electrons are released to participate in the conduction process, which may cause breakdown of the first insulator layer 20. In a way, the damaged surface 18 functions as a catalytic surface to enhance intrinsic breakdown of the first insulator layer 20. When the forward bias (F) is applied, the intrinsic breakdown of the first insulator layer 20 is not enhanced by the unetched bottom surface of the second conductor plate layer 22. Experiments show the breakdown enhancement by damaged surfaces (such as the damaged surface 18) greatly impact the time-dependent-break-down (TDBD) lifetime of the insulator layer. Some experimental results show that when the voltage across the two adjacent conductor plate layers is between about 2 volts (V) and about 2.5V, the forward bias lifetime can be more than 200% better than reverse bias lifetime.

In some applications, an MIM structure may include a low voltage region and a high voltage region that share one ground via. The MIM structure includes a plurality of conductor plate layers interleaved by a plurality of insulator layers. Each of the plurality of conductor plate layers may include conductor plates that are insulated from one another. The conductor plates in a conductor plate layers may be formed by patterning a single conductor plate layer. The low voltage region may include a low voltage contact via that is electrically coupled to a set of conductor plates, which may be referred to as low voltage conductor plates. The high voltage region includes a high voltage via that is electrically coupled to a set of conductor plates, which may be referred to as high voltage conductor plates. The ground via is situated between the low voltage contact via and the high voltage contact via. The ground via is electrically coupled to a set of conductor plates, which may be referred to as ground plates. Both the high voltage conductor plates and the low voltage conductor plates vertically overlap with the ground plates. As will be described below in conjunction with FIGS. 6, 7 and 8, placement of the high voltage conductor plate in such an MIM structure is not trivial.

Figure 6:
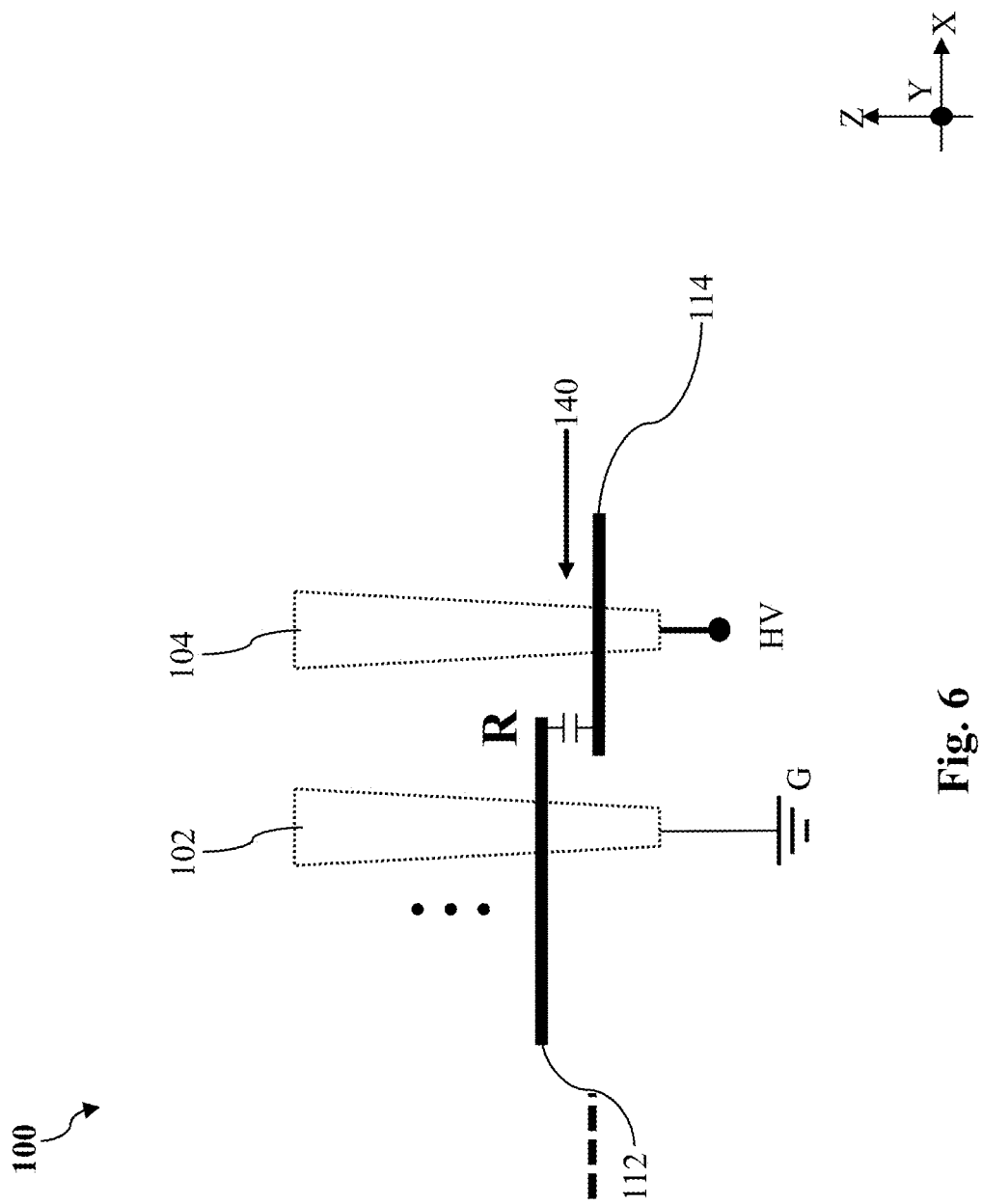
FIG. 6 is a schematic illustration of a first capacitive coupling between a conductor plate coupled to a ground via and a conductor plate coupled to a high voltage via, according to various aspects of the present disclosure.

FIG. 6 illustrates a ground via 102 and a high voltage via 104 of an MIM structure 100. The ground via 102 is electrically coupled to a first ground conductor plate 112 and a plurality of additional ground conductor plates disposed over the first ground conductor plate 112 (representatively shown as dots). The high voltage via 104 is electrically coupled to a high voltage conductor plate 114. The first ground conductor plate 112 extends partially over the high voltage conductor plate 114 and capacitively coupled to the same by way of a first insulator layer 140. To accommodate the higher voltage, the first insulator layer 140 may be thicker than the other insulator layers or may include a dielectric constant greater than that of the other insulator layers. As shown in FIG. 6, because the first ground conductor plate 112 overhangs the high voltage conductor plate 114, a reverse bias (R) is applied across a bottom surface of the first ground conductor plate 112 and a top surface of the high voltage conductor plate 114. As described above, the top surface of the high voltage conductor plate 114 is damaged or roughened. The reverse bias applied across the first insulator layer 140 would result in undesirable TDBD lifetime.

Figure 7:
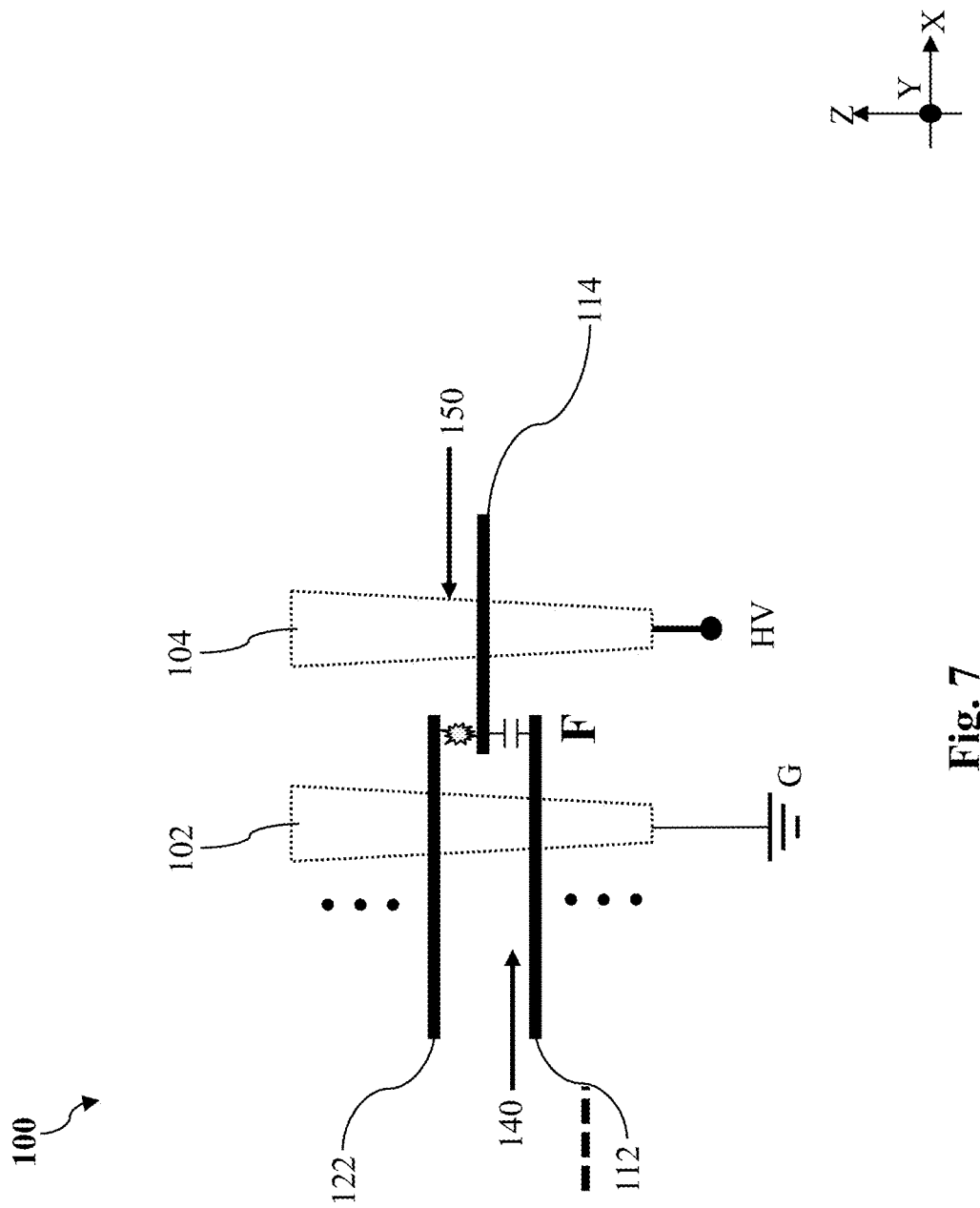
FIG. 7 is a schematic illustration of a second capacitive coupling between a conductor plate coupled to a ground via and a conductor plate coupled to a high voltage via, according to various aspects of the present disclosure.

FIG. 7 illustrates a configuration different from what is shown in FIG. 6. In the example shown in FIG. 7, the high voltage conductor plate 114 is no longer in the lowermost conductor plate layer. In FIG. 7, the high voltage conductor 114 extends partially over and is capacitively coupled to the first ground conductor plate 112. As shown in FIG. 7, because the high voltage conductor plate 114 overhangs the ground conductor plate 112, a forward bias (F) is applied across a bottom surface of the high voltage conductor plate 114 and a top surface of the first ground conductor plate 112. As described above, the bottom surface of the high voltage conductor plate 114 is never etched by any etch process. The forward bias applied across the first insulator layer 140 would result in desirable TDBD lifetime. The MIM structure 100 in FIG. 7 also includes a second ground conductor plate 122 (which is electrically coupled to the ground via 102) that vertically overlaps the high voltage conductor plate 114. The overlapping second ground conductor plate 122 may give rise to lifetime considerations. First, a reverse bias would be applied between the second ground conductor plate 122 and the high voltage conductor plate 114, which would reduce the TDBD lifetime. Second, the reverse bias would be applied across a second insulator layer 150, which is not configured for high voltage applications. That means the high voltage may cause breakdown of the second insulator layer 150. While it is possible to increase the thickness or the dielectric constant of the second insulator layer to match the first insulator layer 140, it may reduce the capacitance between the second ground conductor plate 122 and a conductor plate electrically coupled to a logic contact via (not shown in FIG. 7). As representatively shown in dots, there may be additional conductor plates below the first ground conductor plate 112 or above the second ground conductor plate 122.

Figure 8:
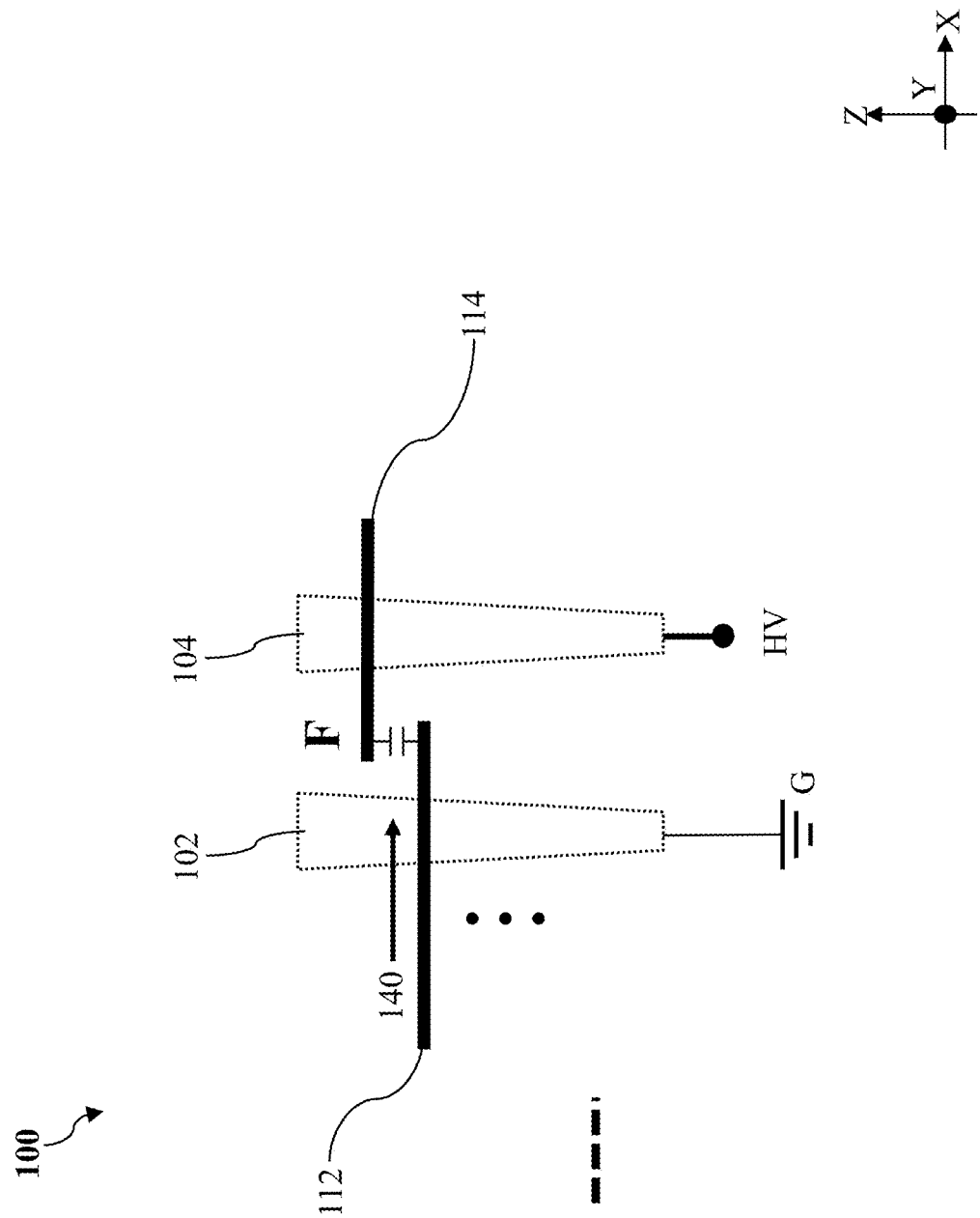
FIG. 8 is a schematic illustration of a third capacitive coupling between a conductor plate coupled to a ground via and a conductor plate coupled to a high voltage via, according to various aspects of the present disclosure.

FIG. 8 illustrates a configuration different from what is shown in FIG. 6 and FIG. 7. In the example shown in FIG. 8, the high voltage conductor plate 114 in the topmost conductor plate layer. The high voltage conductor plate 114 extends partially over and is capacitively coupled to the first ground conductor plate 112. As shown in FIG. 8, because the high voltage conductor plate 114 overhangs the ground conductor plate 112, a forward bias (F) is applied across a bottom surface of the high voltage conductor plate 114 and a top surface of the ground conductor plate 112. As described above, the bottom surface of the high voltage conductor plate 114 is never etched by any etch process. The forward bias applied across the first insulator layer 140 would result in desirable TDBD lifetime. As the high voltage conductor plate 114 is situated in the topmost conductor plate layer, no other conductor plates may vertically overlap the high voltage conductor plate 114 to cause any breakdown concerns. The illustrations in FIGS. 6, 7 and 8 demonstrate that it is critical that the high voltage conductor plate is disposed in the topmost conductor plate layer.

Figure 9:
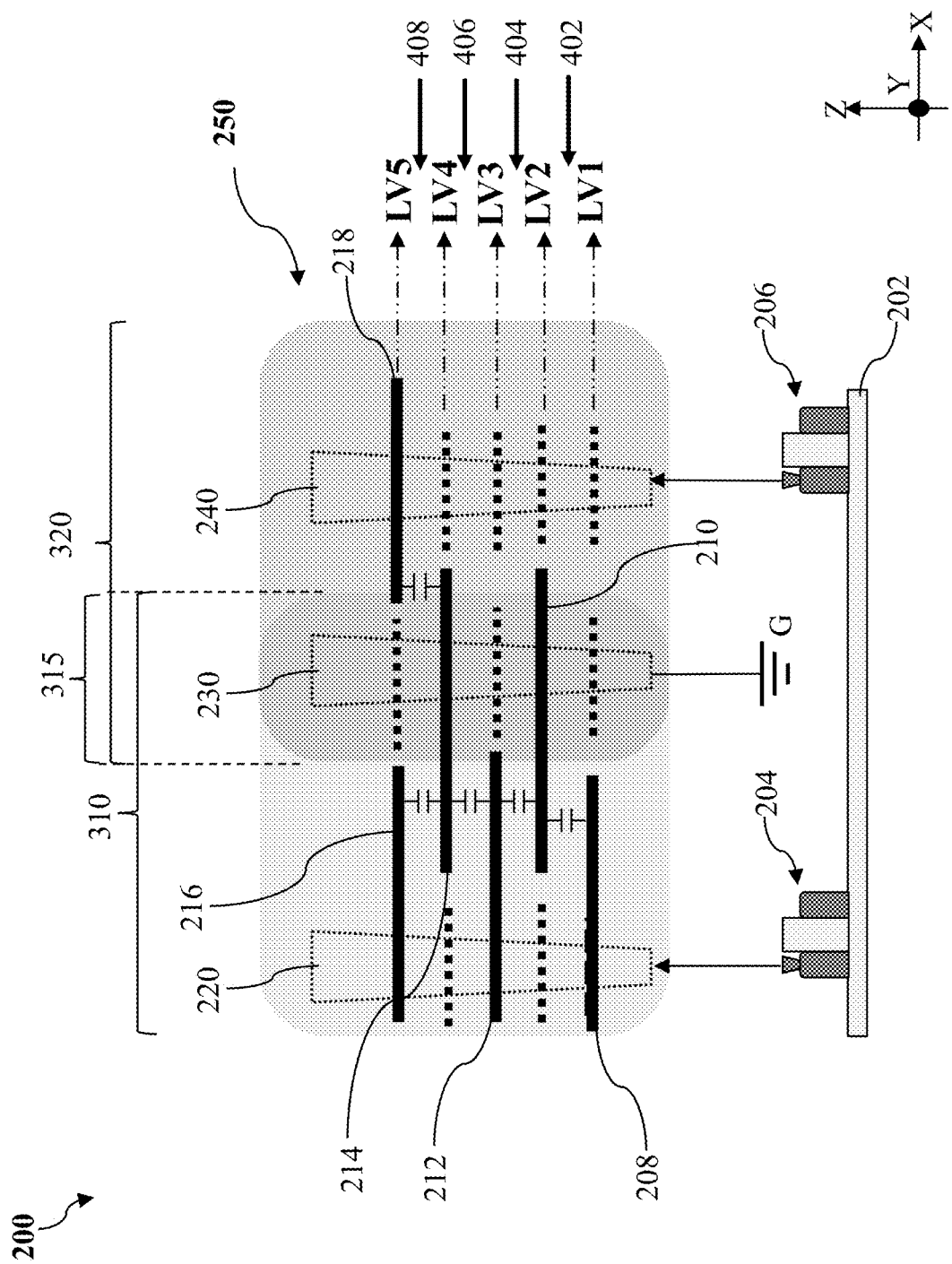
FIG. 9 is a schematic cross-sectional view of a device structure that includes two metal-insulator-metal (MIM) capacitors sharing a common ground via, according to various aspects of the present disclosure.

FIG. 9 illustrates a device structure 200 according to the present disclosure. The device structure 200 includes an MIM structure 250. The device structure 200 includes front-end-of-line (FEOL) structures fabricated on a substrate 202 and the MIM structure 250 at the BEOL level. It is noted that an interconnect structure and a redistribution layer (RDL), both of which are not shown in FIG. 1 for simplicity, may be disposed between the substrate 202 and the MIM structure 250 to provide signal routing. The substrate 202 may include a compound semiconductor, such as silicon carbide (SiC), silicon phosphide (SiP), gallium arsenide (GaAs), gallium phosphide (GaP), indium phosphide (InP), indium arsenide (InAs), indium antimonide (InSb), zinc oxide (ZnO), zinc selenide (ZnSe), zinc sulfide (ZnS), zinc telluride (ZnTe), cadmium selenide (CdSe), cadmium sulfide (CdS), and/or cadmium telluride (CdTe); an alloy semiconductor, such as silicon germanium (SiGe), silicon phosphorus carbide (SiPC), gallium arsenic phosphide (GaAsP), aluminum indium arsenide (AlInAs), aluminum gallium arsenide (AlGaAs), gallium indium arsenide (GaInAs), gallium indium phosphide (GaInP), and/or gallium indium arsenic phosphide (GaInAsP); other group III-V materials; other group II-VI materials; or combinations thereof. Alternatively, the substrate 202 is a semiconductor-on-insulator substrate, such as a silicon-on-insulator (SOI) substrate or a germanium-on-insulator (GeOI) substrate. In some embodiments, the substrate 202 may include an epitaxial layer, for example an epitaxial layer overlying a bulk semiconductor.

The FEOL structures may include a plurality of transistors disposed on the substrate 202. In some embodiments illustrated in FIG. 1, the plurality of transistors may include a logic transistor 204 and a high voltage transistor 206. The logic transistor 203 may be part of a logic gate and the high voltage transistor 106 may be an input/output (I/O) transistor that controls connection to a supply voltage. In some embodiments, the logic transistor 204 may be a multi-bridge-channel (MBC) transistor or a fin-type field effect transistor (FinFET). A FinFET has an elevated channel wrapped by a gate on more than one side (for example, the gate wraps a top and sidewalls of a "fin" of semiconductor material extending from a substrate). An MBC transistor has a gate structure that can extend, partially or fully, around a channel region to provide access to the channel region on two or more sides. Because its gate structure surrounds the channel regions, an MBC transistor may also be referred to as a surrounding gate transistor (SGT) or a gate-all-around (GAA) transistor. The high voltage transistor 206 may be different from the logic transistor 104 in terms of thicknesses of gate dielectric layers or gate length. For example, the logic transistor 204 may be an MBC transistor of a first gate dielectric layer thickness and the high voltage transistor 206 may be an MBC transistor of a second gate dielectric layer greater than the first gate dielectric layer thickness. For another example, the high voltage transistor 206 may have a gate length greater than that of the logic transistor 204. In some other embodiments, the logic transistor 204 may of a different type than the high voltage transistor 206. For example, because a FinFET may be more suitable for high voltage operations than an MBC transistor of a comparable size, the logic transistor 204 may be an MBC transistor while the high voltage transistor 206 may be a FinFET.

The MIM structure 250 may include a plurality of conductor plate layers interleaved by a plurality of insulator layers. In order for embodiments of the present disclosure to work properly, the MIM structure 250 includes at least three conductor plate layers. In the depicted embodiments, the MIM structure 250 includes five conductor plate layers or five levels—a first level (LV1), a second level (LV2) over the first level, a third level (LV3) over the second level, a fourth level (LV4) over the third level, and a fifth level (LV5) over the fourth level. Each of the conductor plate layers or levels includes metal structures that are patterned from a conductor layer deposited in a single deposition process. It is understood that the MIM structure 250 may include more levels to meet design needs. In the depicted embodiment, the first level (LV1) includes a first conductor plate 208. The second level (LV2) includes a second conductor plate 210. The third level (LV3) includes a third conductor plate 212. The fourth level (LV4) includes a fourth conductor plate 214. The fifth level (LV5) includes a fifth conductor plate 216 and sixth conductor plate 218. The first conductor plate 208 in the first level (LV1) is insulated from the second conductor plate 210 in the second level (LV2) by a first insulator layer 402. The second conductor plate 210 in the second level (LV2) is insulated from the third conductor plate 212 in the third level (LV3) by a second insulator layer 404. The third conductor plate 212 in the third level (LV3) is insulated from the fourth conductor plate 214 in the fourth level (LV4) by a third insulator layer 406. The fourth conductor plate 214 in the fourth level (LV4) is insulated from the fifth conductor plate 216 and the sixth conductor plate 218 in the fifth level (LV5) by a fourth insulator layer 408.

Each of the levels includes dummy pads shown in dotted lines. As used herein, a dummy pad is an electrically floating conductor layer that is electrically insulated from any of the conductor plate layers level by insulation layers. A dummy pad is formed along with the conductor plate(s) at the same level. For that reason, it shares the same composition and thickness of the conductor plate layer at the same level. As their name suggest, the dummy pads do not serve any circuit or electrical connection functions. They are inserted to balance out etch loading. As will be described below, a number of contact vias may be formed through different regions of the MIM structure 250. Each of the contact via is formed in a contact via opening that extends through different numbers of conductor plate layers. The dummy pads are inserted such that all of the contact via openings are etched through the same number of metal layers.

The first conductor plate 208, the second conductor plate 210, the third conductor plate 212, the fourth conductor plate 214, the fifth conductor plate 216, the sixth conductor plate 218, and the dummy plates may include titanium nitride (TiN), tantalum nitride (TaN), titanium (Ti), tantalum (Ta), cobalt (Co), nickel (Ni), copper (Cu), or a combination thereof. In one embodiment, they are formed of titanium nitride (TiN). The first insulator layer 402, the second insulator layer 404, the third insulator layer 406, and the fourth insulator layer 408 may include a high-k dielectric material, such as hafnium oxide, hafnium aluminum oxide, hafnium zirconium oxide, zirconium oxide, zirconium aluminum oxide, aluminum oxide, or a combination thereof.

The MIM structure 250 may include a first region 310 and a second region 320. In some embodiments represented in FIG. 9, the first region 310 and the second region 320 overlap at a third region 315. FIG. 9 illustrates three contact vias—a first contact via 220, a second contact via 230, and a third contact via 240. The first contact via 220 extends through the first region 310 and is electrically coupled to a first set of the conductor plates. In the depicted embodiment, the first set includes the first conductor plate 208, the third conductor plate 212 and the fifth conductor plate 216. The second contact via 230 extends through the third region 315 and is electrically coupled to a second set of conductor plates. The second set includes the second conductor plate 210 and the fourth conductor plate 214. The third contact via 240 extends through the second region 320 and is electrically coupled to a third set of conductor plate layers. In the depicted embodiment, the third set includes the sixth conductor plate layer 218.

Each of the first set of the conductor plates is capacitively coupled to at least one of the second set of conductor plates. In the depicted embodiment, due to vertical areal overlapping, the fifth conductor plate 216 (in the first set) is capacitively coupled to the fourth conductor plate 214 (in the second set). The third conductor plate 212 (in the first set) is capacitively coupled to the fourth conductor plate 214 (in the second set) and the second conductor plate 210 (in the second set). The first conductor plate 208 (in the first set) is capacitively coupled to the second conductor plate 210 (in the second set). Through the interconnect structure and the RDL, the first contact via 220 is electrically coupled to a source/drain of the logic transistor 204, the second contact via 230 is electrically coupled to a ground voltage (G), and the third contact via 240 is electrically coupled to a source/drain of the high voltage transistor 206. This way, the first region 310 functions as a logic MIM capacitor, with the first contact via 220 serving as a low-voltage contact via and the second contact via 230 serving as a ground via. The capacitance between the first contact via 220 and the second contact via 230 is defined by the capacitance due over vertical overlap of the first set and the second set of the conductor plates. Because the first contact via 220 is a low voltage contact via, the first conductor plate 208, the third conductor plate 212 and the fifth conductor plate 216 are low voltage conductor plates as they are electrically coupled to a low voltage contact via. Because the second contact via 230 is a ground via, the second conductor plate 210 and the fourth conductor plate 214 are ground plates as they are electrically coupled to a ground via.

At least one of the second set of the conductor plates is capacitively coupled to at least one of the third set of conductor plates. In the depicted embodiment, due to vertical areal overlapping, the sixth conductor plate 218 (in the third set) is capacitively coupled to the fourth conductor plate 214 (in the second set). Through the interconnect structure and the RDL, the third contact via 240 is electrically coupled to a source/drain of the high voltage transistor 206 and the second contact via 230 is electrically coupled to a ground voltage (G). This way, the second region 320 functions as a high voltage MIM capacitor, with the third contact via 240 serving as a high voltage contact via and the second contact via 230 serving as a ground via. The capacitance between the third contact via 240 and the third contact via 230 is defined by the capacitance between the second set and the third set of the conductor plates. The three set of conductor plates are different from one another and are insulated from one another. Because the third contact via 240 serves as a high voltage via, the sixth conductor plate 218, which is electrically coupled to the third contact via 240, is a high voltage plate.

With the first contact via 220 coupled to the logic transistor 204, the first region 310 functions as a logic MIM region 310 or a logic MIM capacitor 310. With the third contact via 240 coupled to the high voltage transistor 206, the second region 320 functions as a high voltage MIM region 320. The logic MIM capacitor 310 and the high voltage MIM capacitor 320 share the same ground via 230 (i.e., the second contact via 230). Although the logic MIM capacitor 310 and the high voltage MIM capacitor 320 share the same ground voltage, they may have different operating voltages. For example, the logic MIM capacitor 310 may have a standard operating voltage between about 0.8 volts and about 1.5 volts and the high voltage MIM capacitor 320 may have an operating voltage between about 1.8 volts and about 4.0 volts. A capacitance of the logic MIM capacitor 310 is different from a capacitance of the high voltage MIM capacitor 320.

In order to accommodate different operating voltages, the fourth insulation layer 408 that affects the capacitance of the high voltage MIM capacitor 320 may be different from the other insulation layers 402, 404 and 406 that affect the capacitance of the logic MIM capacitor 310 in terms of material and thickness. Generally speaking, the high voltage MIM capacitor 320 operates at a higher voltage that requires either a greater thickness or a material of higher dielectric constant. In some embodiments, a thickness of the fourth insulation layer 408 may be about 2-4 times of a thickness of each of the first insulation layer 402, the second insulation layer 404, or the third insulation layer 406. In some other embodiments, a dielectric constant of the fourth insulation layer 408 may be greater than a dielectric contact of the other insulation layers. In one example, the fourth insulation layer 408 includes hafnium oxide while the other insulation layers (i.e., 402, 404, and 406) include aluminum oxide or hafnium aluminum oxide. In another example, the fourth insulation layer 408 includes hafnium zirconium oxide or zirconium oxide while the other insulation layers (i.e., 402, 404, and 406) include hafnium oxide or hafnium aluminum oxide.

Although not intended to be limiting, one or more embodiments of the present disclosure provide many benefits to a device structure. For example, embodiments of the present disclosure an MIM structure that includes a low voltage region and a high voltage region that share a common ground via. The contact via in the high voltage region is coupled to a high voltage conductor plate in a topmost conductor plate layers. This configuration ensures good TDBD lifetime.

One aspect of the present disclosure involves a device structure. The device structure includes a metal-insulator-metal (MIM) stack. The MIM stack includes at least one lower conductor plate layer, a first insulator layer disposed over the at least one lower conductor plate layer, a first conductor plate layer disposed over the first insulator layer, a second insulator layer disposed over the first conductor plate layer, and a second conductor plate layer disposed over the second insulator layer. The device structure further includes a ground via extending through and electrically coupled to a first ground plate in the first conductor plate layer and a first via extending through and electrically coupled to a high voltage plate in the second conductor plate layer. The first ground plate vertically overlaps the high voltage plate and the second insulator layer is different from the first insulator layer.

In some embodiments, the at least one lower conductor plate layer includes three conductor plate layers. In some implementations, a thickness of the second insulator layer is greater than a thickness of the first insulator layer. In some instances, a dielectric constant of the second insulator layer is greater than a dielectric constant of the first insulator layer. In some embodiments, the ground via is grounded to a ground voltage and the first via is electrically coupled to a high voltage transistor disposed below the MIM stack. In some implementations, the device structure further includes a second via extending through and electrically coupled to a standard voltage plate in the second conductor plate layer. The second via is electrically coupled to a logic transistor disposed below the MIM stack and the standard voltage plate is electrically insulated from the high voltage plate. In some embodiments, the first ground plate vertically overlaps the standard voltage plate. In some instances, the logic transistor is different from the high voltage transistor. In some instances, the logic transistor includes a first gate dielectric layer, the high voltage transistor includes a second gate dielectric layer, and a thickness of the second gate dielectric layer is greater than a thickness of the first gate dielectric layer. In some embodiments, the logic transistor includes a plurality of nanostructures stacked one over another and a first gate structure wrapping around each of the plurality of nanostructures. The high voltage transistor includes a fin structure, and a second gate structure wrapping over a top surface and sidewalls of the fin structure.

Another aspect of the present disclosure involves a device structure. The device structure includes a metal-insulator-metal (MIM) stack. The MIM stack includes at least one lower conductor plate layer, a first insulator layer disposed over the at least one lower conductor plate layer, first conductor plate layer disposed over the first insulator layer, a second insulator layer disposed over the first conductor plate layer, a second conductor plate layer disposed over the second insulator layer, a ground via extending through and electrically coupled to a first ground plate in the first conductor plate layer, and a first via extending through and electrically coupled to a high voltage plate in the second conductor plate layer, and a second via extending through and electrically coupled to a standard voltage plate in the second conductor plate layer. The first ground plate vertically overlaps the high voltage plate and the standard voltage plate, the high voltage plate is electrically insulated from the standard voltage plate, and the second insulator layer is different from the first insulator layer.

In some embodiments, a thickness of the second insulator layer is greater than a thickness of the first insulator layer. In some implementations, a dielectric constant of the second insulator layer is greater than a dielectric constant of the first insulator layer. In some implementations, the ground via is grounded to a ground voltage and the first via is electrically coupled to a high voltage transistor disposed below the MIM stack, and the second via is electrically coupled to a logic transistor disposed below the MIM stack. In some instances, the logic transistor is different from the high voltage transistor. In some embodiments, the at least one lower conductor plate layer, the first conductor plate layer and the second conductor plate layer include titanium nitride. In some embodiments, the first insulator layer and the second insulator layer include hafnium oxide, hafnium aluminum oxide, hafnium zirconium oxide, zirconium oxide, zirconium aluminum oxide, aluminum oxide, silicon nitride, or a combination thereof.

Still another aspect of the present disclosure involves a device structure. The device structure includes a capacitor stack. The capacitor stack includes a first conductor plate layer, a first insulator layer over the first conductor plate layer, a second conductor plate layer over the first insulator layer, a second insulator layer over the second conductor plate layer, a third conductor plate layer over the second insulator layer, a third insulator layer over the third conductor plate layer, a fourth conductor plate layer over the third insulator layer, a fourth insulator layer over the fourth conductor plate layer, and a fifth conductor plate layer over the fourth insulator layer. The device structure further includes a ground via extending through and electrically coupled to a first ground plate in the second conductor plate layer and a second ground plate in the fourth conductor plate layer, a first via extending through and electrically coupled to a high voltage plate in the fifth conductor plate layer; and a second via extend through a first standard voltage plate in the first conductor plate layer, a second standard voltage plate in the third conductor plate layer, and a third standard voltage plate in the fifth conductor plate layer. The first ground plate and the second ground plate vertically overlap the first standard voltage plate, the second standard voltage plate and the third standard voltage plate. The high voltage plate vertically overlaps the first ground plate.

In some embodiments, The device structure of claim 18, wherein the fourth insulator layer is different from the first insulator layer, the second insulator layer and the third insulator layer in terms of thickness. In some instances, the fourth insulator layer is different from the first insulator layer, the second insulator layer and the third insulator layer in terms of composition.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device structure, comprising:
   a metal-insulator-metal (MIM) stack comprising:
     at least one lower conductor plate layer,
     a first insulator layer disposed over the at least one lower conductor plate layer,
     a first conductor plate layer disposed over the first insulator layer,
     a second insulator layer disposed over the first conductor plate layer, and
     a second conductor plate layer disposed over the second insulator layer;
   a ground via extending through and electrically coupled to a first ground plate in the first conductor plate layer; and
   a first via extending through and electrically coupled to a high voltage plate in the second conductor plate layer,
   wherein the first ground plate vertically overlaps the high voltage plate,
   wherein the second insulator layer is different from the first insulator layer.

2. The device structure of claim 1, wherein the at least one lower conductor plate layer comprises three conductor plate layers.

3. The device structure of claim 1, wherein a thickness of the second insulator layer is greater than a thickness of the first insulator layer.

4. The device structure of claim 1, wherein a dielectric constant of the second insulator layer is greater than a dielectric constant of the first insulator layer.

5. The device structure of claim 1,
wherein the ground via is grounded to a ground voltage,
wherein the first via is electrically coupled to a high voltage transistor disposed below the MIM stack.

6. The device structure of claim 5, further comprising:
a second via extending through and electrically coupled to a standard voltage plate in the second conductor plate layer,
wherein the second via is electrically coupled to a logic transistor disposed below the MIM stack,
wherein the standard voltage plate is electrically insulated from the high voltage plate.

7. The device structure of claim 6, wherein the first ground plate vertically overlaps the standard voltage plate.

8. The device structure of claim 6, wherein the logic transistor is different from the high voltage transistor.

9. The device structure of claim 6,
wherein the logic transistor comprises a first gate dielectric layer,
wherein the high voltage transistor comprises a second gate dielectric layer,
wherein a thickness of the second gate dielectric layer is greater than a thickness of the first gate dielectric layer.

10. The device structure of claim 6,
wherein the logic transistor comprises:
a plurality of nanostructures stacked one over another, and
a first gate structure wrapping around each of the plurality of nanostructures, and
wherein the high voltage transistor comprises:
a fin structure, and
a second gate structure wrapping over a top surface and sidewalls of the fin structure.

11. A device structure, comprising:
a metal-insulator-metal (MIM) stack comprising:
at least one lower conductor plate layer,
a first insulator layer disposed over the at least one lower conductor plate layer,
a first conductor plate layer disposed over the first insulator layer,
a second insulator layer disposed over the first conductor plate layer, and
a second conductor plate layer disposed over the second insulator layer;
a ground via extending through and electrically coupled to a first ground plate in the first conductor plate layer;
a first via extending through and electrically coupled to a high voltage plate in the second conductor plate layer; and
a second via extending through and electrically coupled to a standard voltage plate in the second conductor plate layer,
wherein the first ground plate vertically overlaps the high voltage plate and the standard voltage plate,
wherein the high voltage plate is electrically insulated from the standard voltage plate,
wherein the second insulator layer is different from the first insulator layer.

12. The device structure of claim 11, wherein a thickness of the second insulator layer is greater than a thickness of the first insulator layer.

13. The device structure of claim 11, wherein a dielectric constant of the second insulator layer is greater than a dielectric constant of the first insulator layer.

14. The device structure of claim 11,
wherein the ground via is grounded to a ground voltage,
wherein the first via is electrically coupled to a high voltage transistor disposed below the MIM stack,
wherein the second via is electrically coupled to a logic transistor disposed below the MIM stack.

15. The device structure of claim 14, wherein the logic transistor is different from the high voltage transistor.

16. The device structure of claim 11, wherein the at least one lower conductor plate layer, the first conductor plate layer and the second conductor plate layer comprise titanium nitride.

17. The device structure of claim 11, wherein the first insulator layer and the second insulator layer comprise hafnium oxide, hafnium aluminum oxide, hafnium zirconium oxide, zirconium oxide, zirconium aluminum oxide, aluminum oxide, silicon nitride, or a combination thereof.

18. A device structure, comprising:
a capacitor stack, the capacitor stack comprising:
a first conductor plate layer,
a first insulator layer over the first conductor plate layer,
a second conductor plate layer over the first insulator layer,
a second insulator layer over the second conductor plate layer,
a third conductor plate layer over the second insulator layer,
a third insulator layer over the third conductor plate layer,
a fourth conductor plate layer over the third insulator layer,
a fourth insulator layer over the fourth conductor plate layer, and
a fifth conductor plate layer over the fourth insulator layer,
a ground via extending through and electrically coupled to a first ground plate in the second conductor plate layer and a second ground plate in the fourth conductor plate layer;
a first via extending through and electrically coupled to a high voltage plate in the fifth conductor plate layer; and
a second via extend through a first standard voltage plate in the first conductor plate layer, a second standard voltage plate in the third conductor plate layer, and a third standard voltage plate in the fifth conductor plate layer,
wherein the first ground plate and the second ground plate vertically overlap the first standard voltage plate, the second standard voltage plate and the third standard voltage plate,
wherein the high voltage plate vertically overlaps the first ground plate.

19. The device structure of claim 18, wherein the fourth insulator layer is different from the first insulator layer, the second insulator layer and the third insulator layer in terms of thickness.

20. The device structure of claim 18, wherein the fourth insulator layer is different from the first insulator layer, the second insulator layer and the third insulator layer in terms of composition.

* * * * *